United States Patent [19]

Adkins

[11] 4,408,255
[45] Oct. 4, 1983

[54] ABSORPTIVE ELECTROMAGNETIC SHIELDING FOR HIGH SPEED COMPUTER APPLICATIONS

[76] Inventor: Harold Adkins, 56 Camille La., East Patchogue, N.Y. 11772

[21] Appl. No.: 224,319

[22] Filed: Jan. 12, 1981

[51] Int. Cl.³ ............................................. H05K 7/20
[52] U.S. Cl. ................................. 361/382; 361/383; 361/424; 174/35 MS; 343/18 A
[58] Field of Search ................... 343/18 A; 174/35 R, 174/35 MS; 361/381–384, 386, 385, 424, 395, 399, 398

[56] References Cited

U.S. PATENT DOCUMENTS

| 3,349,397 | 10/1967 | Rosenthal | 343/18 A |
|---|---|---|---|
| 3,526,896 | 9/1970 | Wesch | 343/18 A |
| 3,733,606 | 5/1973 | Johansson | 343/18 A |
| 4,012,738 | 3/1977 | Wright | 343/18 A |
| 4,029,999 | 6/1977 | Neumann | 361/386 |
| 4,287,243 | 9/1981 | Nielsen | 343/18 A |

FOREIGN PATENT DOCUMENTS 1088408 10/1967 United Kingdom .......... 174/35 MS

Primary Examiner—G. P. Tolin
Attorney, Agent, or Firm—Kevin Redmond

[57] ABSTRACT

An electromagnetic shield comprising two portions in which the first portion consists of a magnetically permeable mat with a conductive sheet bonded to one side and an insulating sheet bonded to the opposite side. In a typical application, this first portion is positioned with the insulating sheet making contact to the underside of a printed circuit board. The second portion consists of a magnetically permeable mat with a conductive sheet bonded to each side. The mat is porous and one of the conductive sheets contains a plurality of openings to permit cooling air which is forced through the pores of the mat to pass through these openings. The conductive sheet containing the plurality of openings is positioned adjacent the components on the upper side of a printed circuit board to provide cooling as well as closely positioned shielding.

2 Claims, 10 Drawing Figures

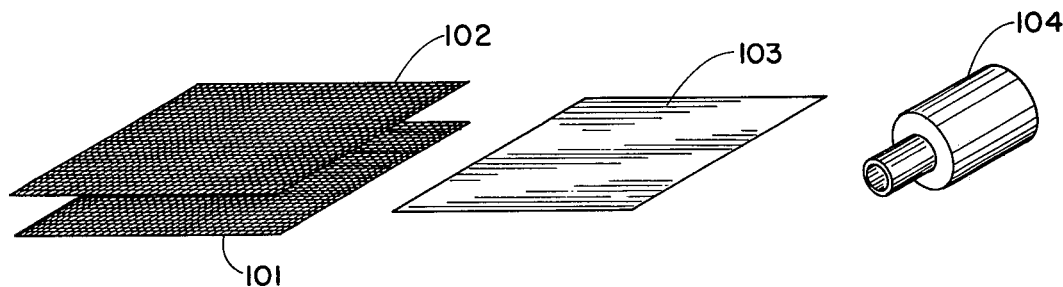
Fig. 1A Prior Art
Fig. 1B Prior Art
Fig. 1C Prior Art
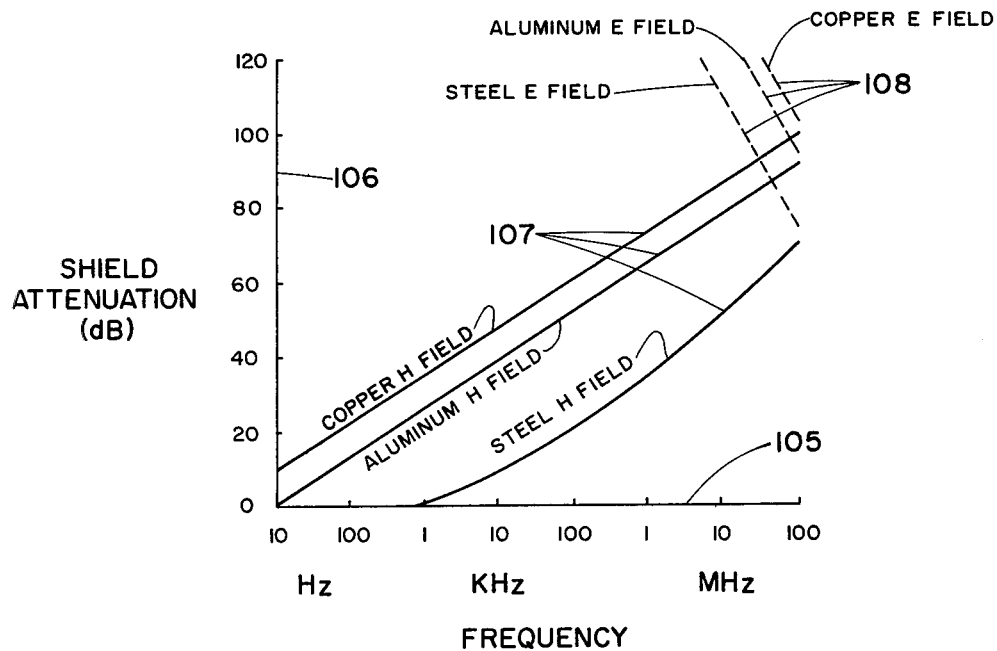
Fig. 1D Prior Art

ABSORPTIVE ELECTROMAGNETIC SHIELDING FOR HIGH SPEED COMPUTER APPLICATIONS

BACKGROUND

1. Field

This invention relates to electromagnetic shielding and, in particular, to absorptive electromagnetic shielding intended for applications in high speed computers and other circuitry where fast rise times are present.

2. Prior Art

Electromagnetic interference (EMI) is unintentional radiation from electronic equipment which can interfere with external equipment such as radio, television or computer units, as well as interfere with internal circuitry within the unit generating the EMI. EMI has become increasingly important because of the substantial growth in the volume of electronic equipment, much of which is capable of either generation or being interferred with by EMI. The importance of EMI in the computer field has increased in part because of the increase in the speed of operation of modern computers which manifest itself electrically within the computer as signals with rise times as short as two nanoseconds. Such fast rise times are a natural source of wide spectrum interference. One of the most serious EMI problems is the interference caused by computers to their own operation. Computers may affect the operation of other computers positioned nearby by direct radiation and may also interfere with other computers which are remotely located by transmitting EMI along the interconnection lines intended to transmit data.

Prior art techniques for containing electromagnetic interference have been confined essentially to placing shielding boxes about the equipment producing the interference. Typical examples of prior art electromagnetic interference shielding are shown in FIGS. 1A, 1B and 1C. FIG. 1A illustrates a double screen shield in which the first screen is designated 101 while the second is designated 102. This type of shield is primarily used about screen rooms. FIG. 1B shows a solid sheet of conducting materials such as aluminum, designated by drawing numeral 103. This type of shielding is used for screen rooms and in shielding boxes about electronic equipment. FIG. 1C shows a tubular shield 104 made of conducting material such as aluminum, typically used about cable connections.

A primary problem with prior art shielding is the screen, sheet and tubular shield are incapable of absorbing EMI. These shields merely reflect the EMI, causing interference to the circuits which have generated the EMI. In many cases, the shielding boxes used in prior art systems must include provisions for cable connections to enable the equipment contained within these boxes to function. Although the EMI may be prevented from radiating directly through the shielding boxes, it can be carried out of the boxes on the cables to interfere with external equipment.

A third problem encountered with conventional shielding is illustrated by the graph shown in FIG. 1D. In this graph, the ordinate 106 indicates shielding attenuation in decibels while the abscissa 105 indicates frequency ranging from hertz through megahertz. Three solid line graphs 107 represent the H-field of copper, aluminum and steel while three dashed line graphs 108 represent the E-field of copper, aluminum and steel. It can be seen that the H-field attenuation at low frequency in the hertz range is almost negligible, while at high frequencies in the range of hundreds of megacycles the E-field attenuation is also negligible. It is apparent from these plots that low frequency H-field radiation can pass through conventional shielding as can high frequency E-field radiation. The high frequency E-field signals are easily generated in computers which are now operating with clock rates of 100 MHz and rise times in the order of two nanoseconds. In addition, many computers also produce the low frequency H-fields which penetrate conventional shielding as well.

A fourth problem is in the fabrication of prior art shielding boxes with provisions enabling them to be easily removed for servicing while at the same time avoiding a seam or opening through which EMI may be radiated.

SUMMARY

It is an object of the present invention to provide EMI shielding which absorbs rather than reflects EMI radiation.

It is an object of the present invention to provide EMI shielding which prevents the EMI radiation from passing through cables interconnecting electrically shielded units.

It is an object of the present invention to provide EMI shielding which includes provisions for controlling the temperature of the electronic equipment contained within the shielding.

It is an object of the present invention to provide EMI shielding which is compatible with printed circuit boards and typical computer packaging.

It is an object of the present invention to provide electromagnetic shielding which can easily be fitted to individual circuits.

A principal application of the present invention is the shielding of printed circuit boards, especially those used in computer applications. The shielding of one embodiment of the present invention comprises two portions. The first portion is located beneath a printed circuit board, while the second is located above the board, directly over the components. The first portion comprises a mat of magnetically permeable material with a sheet of conductive material bonded on one side and a sheet of insulating material bonded to the opposite side. This shield is positioned so that the insulating sheet makes contact with the lower portion of the printed circuit board containing the printed circuit lines.

The second portion of the shielding comprises a second mat of magnetically permeable material with a sheet of conductive material bonded to each side. One of the conductive sheets may include a plurality of holes. The second portion of the shield is placed adjacent the components on the upper side of the printed circuit board. Fluid, such as cooling air, may be forced through the pores of the mat and out of the plurality of holes to control the temperature of the components on the board.

The proximity of the shielding to the circuitry aids greatly in its effectiveness by absorbing the EMI before it radiates through the box, is conducted away on cables or transfers to nearby circuits. The absorptive nature of the shield for H-fields is provided by the permeable mat which greatly reduces fields which were previously able to propagate through prior art shielding.

The shielding of the present invention is fabricated from thin sheets and a flexible mat making it possible to easily cut to size and adapt this shielding to various circuit sizes and configurations.

BRIEF DESCRIPTION OF THE DRAWINGS

FIG. 1 illustrates a prior art double screened shield.

FIG. 1B illustrates a prior art conductive sheet shield.

FIG. 1C illustrates a prior art tubular conductive shield intended for use with electrical connectors.

FIG. 1D is a graph of shield attenuation as a function of frequency for various types of shielding materials.

DETAILED DESCRIPTION OF THE INVENTION

The primary problem encountered in the application of prior art shielding is its inability to absorb EMI radiation. If the EMI radiation can be absorbed near its source, it cannot be propagated on the interconnecting cables or reflected about within conventional shielding boxes to effect other portions of the circuit, nor can it radiate through openings often occurring in such boxes.

Figure 2:
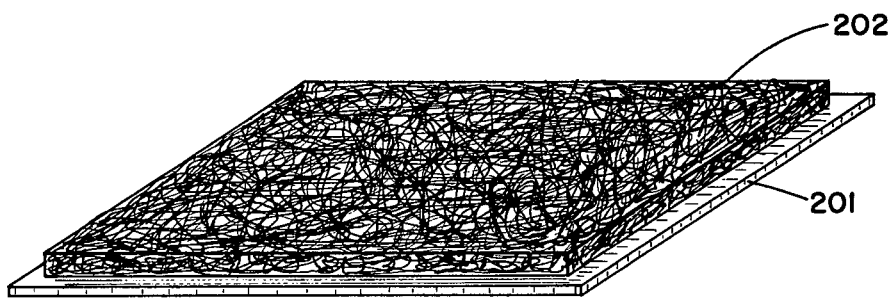
FIG. 2 illustrates a first embodiment of the present invention comprising a conductive sheet bonded to an absorptive mat.

FIG. 2 illustrates a fundamental embodiment of the present invention, comprising a conductive sheet 201 and a mat of absorptive material 202. The absorptive mat 202 may comprise material such as steel wool, carbon-impregnated rubber, ferrite in a plastic stranded carrier, a combination of these or other similar lossy materials with the spacing between the members of the mat made less than one one-hundredth of a wavelength at the highest frequency to be shielded, thus making the mat a poor radiator and consequently a good absorber of the frequencies below this highest frequency. Typically, the conductive sheet 201 is made extremely thin and the mat is fabricated from material which may be easily cut to aid in fitting this shielding about the contours of a particular circuit. In many cases, the absorptive mat may be placed in direct contact with components. The closeness with which this type of shielding may be placed to the circuitry considerably aids in reducing the radiation at its source and the amount of shielding is reduced since the area is much less than at the edge of the shielding box. The mat portion can be placed on nonconductive portions of the circuitry such as plastic printed circuit modules, which conductive sheet 201 is positioned away from the modules.

In the operation of this shielding, the low frequency H-fields and the E-fields are absorbed by the mat. EMI which penetrate the mat tends to be reflected back through the mat by the conductive sheet for further absorption.

Figure 3:
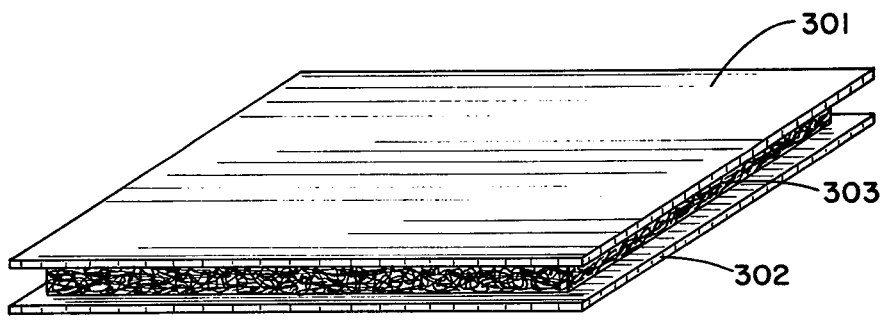
FIG. 3 illustrates a second embodiment of the present invention comprising two conductive sheets bonded to either side of an absorptive mat.

FIG. 3 illustrates a second embodiment of the present invention which is similar to that shown in FIG. 2 only with an additional second conductive sheet bonded to the opposite side of the mat to provide additional shielding. In this Figure, it can be seen that this embodiment comprises a first conductive sheet 301, bonded to a first side of absorptive mat 303, and a second conductive sheet 302 bonded to the opposite side of the mat. This type of shielding may be used in a manner similar to that described for the embodiment in FIG. 2, especially where plastic components on the circuit board provide an insulating layer which will prevent contact with a conducting sheet from causing interference with operation of the circuitry.

It should be noted that in any of these embodiments of the invention, the thickness of the mat may be varied as necessary to absorb a particular type of radiation. In addition, the elements forming the mat may be varied as necessary to meet the special requirements of an application, such as attenuating a type of radiation which predominates in a particular application. For example, the mat may include a high percentage of lossy rubber where it is desired to attenuate microwave radiation.

FIG. 4 illustrates an embodiment of the present invention designed to prevent radiation from either side of a printed circuit board and also to control the temperature of the components on the board.

Figure 4A:
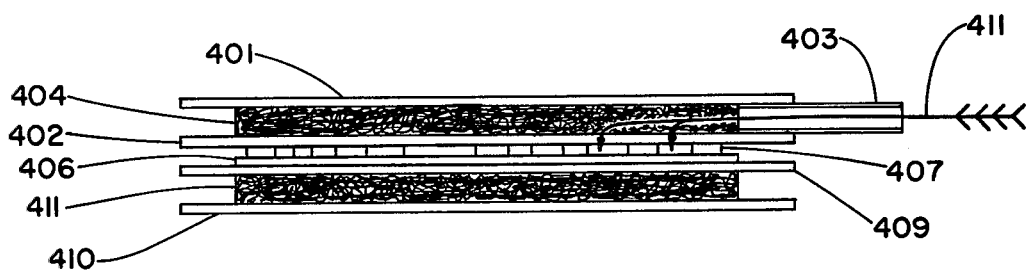
FIG. 4A is a side view of the third embodiment of the present invention which includes provision for controlling the temperature of components.
Figure 4B:
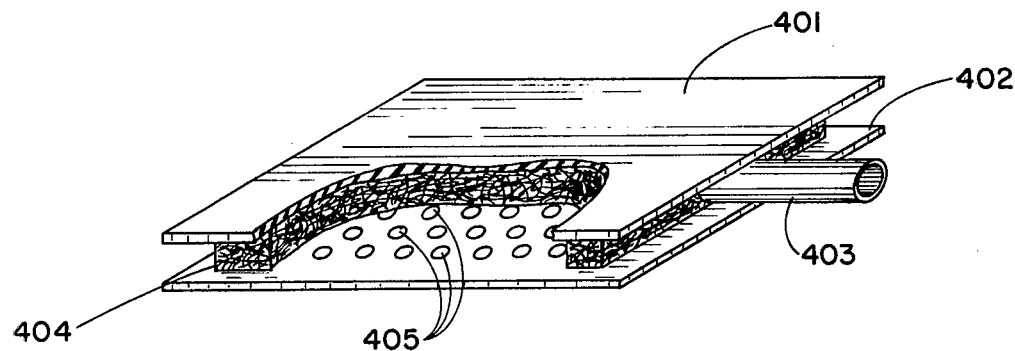
FIG. 4B is a perspective view of the upper portion of the embodiment shown in 4A.
Figure 4C:
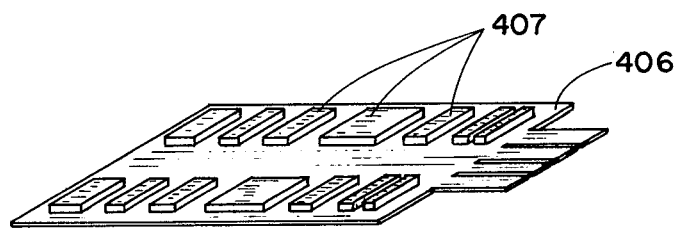
FIG. 4C is a perspective view of the top portion of a printed circuit board, illustrating a typical layout of components.
Figure 4D:
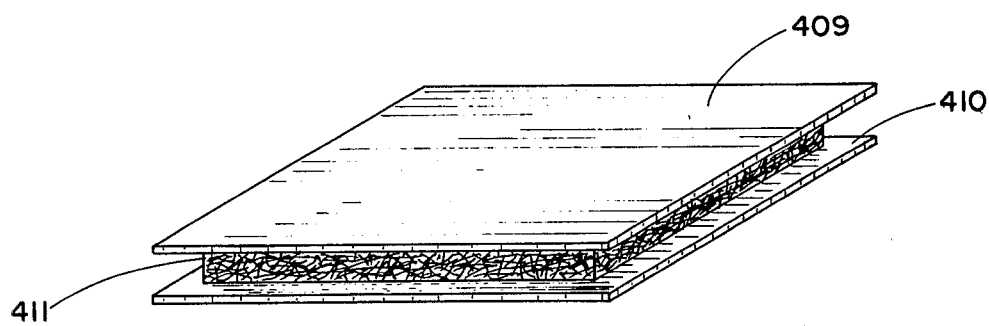
FIG. 4D illustrates the lower portion of the embodiment shown in 4A.

FIG. 4A is a side view of this invention while FIG. 4B is a perspective view of the upper portion. FIG. 4C shows in perspective view of a printed circuit board alone prior to insertion between the upper shielding of FIG. 4B and the lower shielding of FIG. 4D.

Referring now to FIG. 4A, the upper shielding portion consists of a conductive sheet 401 bonded to a mat 404, and a second conductive sheet 402 bonded to the opposite side of the mat 404. Directly beneath the upper shielding portion is a printed circuit board 406 having components 407 on its upper side. Beneath the printed circuit board is the lower shield formed of an insulating sheet 409 bonded to one side of an absorptive mat 411 and a first conductive sheet 410 bonded to the opposite side of the mat 411. The conductive sheet 402 in the upper portion of the shield contains a plurality of openings 405 (shown in FIG. 4B), which pass through the sheet. Between the upper sheet 404 and the lower sheet 402, is a fluid intake conduit 403 through which fluid may be forced as indicated by the directional arrow 411. The fluid enters the pores in the mat, passes through the openings 405 and flows about the components on the board 407 to control their temperature. The fluid is typically cooling air to reduce the temperature produced by power dissipation within the components.

In the operation of the shielding shown in FIG. 4, EMI arising from the components must pass through the metal shield 402, the absorptive mat 404 and the upper shield 401 before reaching any conventional shielding box. Usually, in this process, the radiation will have been reduced to acceptable levels or effectively eliminated. The proximity with which the upper shield may be placed to the components aids greatly in reducing the EMI field reaching other components within the originating circuit as well as other electrical units located away from the originating circuit. The small space between the shield and the components acts as a waveguide below cutoff which has a very high attenuation.

The lower portion of the shield includes an insulating sheet 409 which may be placed directly against the printed wiring contained on the lower portion of a printed circuit board, without shorting the circuit. EMI radiation present on the lower portion of the board must pass through the mat 411 and the conductive sheet 410 before progressing to the conventional shielding boxes located beyond. By absorbing the radiation at its source, the far field is greatly reduced, as is the amount of radiation which is available to propagate out through connectors and cables usually used in conjunction with conventional shielding box.

The porosity of the shielding mat has been taken advantage of in providing a means of delivering cooling air to the components. The holes 405 in the shielding sheet 402 typically are small so that they function as a screen type shield, permitting the shield to remain effective despite the openings. Conductive cooling by contact with the sheets and mat is also very effective.

A number of variations are considered within the spirit and scope of the invention. For example, the mat may be molded to fit the exact shape of the components, allowing the mat to completely surround the component and touch the printed circuit board. The metal and plastic sheets may also be similarly molded to completely surround the components where it is desired to apply these embodiments of the invention in this manner. Materials of various permeabilities and thicknesses and sheet materials of various conductivities may be satisfactory for particular applications; however, it has been found best for most applications for the mat permeability to exceed 20 and the mat thickness to range between 0.001 to 0.25 inch, while the sheet resistivity ranges between $1.5 \times 10^{-6}$ to $100 \times 10^{-6}$ ohm centimeters.

Magnetically permeable material as used herein is defined as material in which the magnetic permeability exceeds unity.

Having described my invention, I claim:

1. An electromagnetic interference shield for direct application to circuitry, comprising:
    (a) a flexible mat of porous electrically lossy material,
    (b) a first sheet of continuous conductive material which is impervious to liquids,
    (c) means for bonding the first sheet to a first side of the mat to form a composite shield,
    (d) a second sheet of conductive material bonded to the second side of the mat, the second sheet of conductive material containing a plurality of openings passing through the sheet and the shield further comprising means for forcing the fluid between the sheets through the pores of the mat and out through the plurality of openings to aid in adjusting the temperature of the circuitry adjacent the second sheet of conductive material.

2. An electromagnetic interference shield combined with a printed circuit board having components on one side and printed circuitry on the opposite side, comprising:
    (a) a first flexible mat of porous electrically lossy and magnetically permeable material,
    (b) a first sheet of conductive material bonded to one side of the first mat,
    (c) a sheet of insulating material bonded to the opposite side of the first mat, the insulated sheet being placed against the printed circuit side of the printed circuit board,
    (d) a second flexible mat of porous magnetically permeable material,
    (e) a second sheet of conductive material bonded to one side of the second mat, a third sheet of conductive material bonded to the opposite side of the conductive mat, the third sheet of conductive material having a plurality of openings passing through this sheet, said third conductive sheet being placed over the compoents on the printed circuit board, and
    (f) a conduit connected between the second and third conductive sheets to accept a fluid which may be passed through the conduit, the pores of the mat and the holes of the third conductive sheet to flow about the components on the printed circuit board to control their temperature.

* * * * *